United States Patent [19]

Edwards et al.

[11] Patent Number: 5,650,662
[45] Date of Patent: Jul. 22, 1997

[54] DIRECT BONDED HEAT SPREADER

[76] Inventors: Steven F. Edwards, 702 N. Oak Cliff Blvd., Dallas, Tex. 75208; Peter Maier, Hugo Dietz Str. 19; Jurgen Shultz-Harder, Hugo Dietz Str. 32, both of 8650 Lauf, Germany

[21] Appl. No.: 293,510

[22] Filed: Aug. 19, 1994

[30] Foreign Application Priority Data

| Aug. 17, 1993 | [DE] | Germany | 43 27 641.5 |
| Aug. 24, 1993 | [DE] | Germany | 43 28 353.5 |
| Oct. 29, 1993 | [DE] | Germany | 43 36 944.8 |
| Nov. 12, 1993 | [DE] | Germany | 43 38 706.3 |

[51] Int. Cl.$^6$ .................................................. H01L 23/12
[52] U.S. Cl. .......................... 257/700; 257/701; 257/712; 257/713; 257/717
[58] Field of Search ............................. 257/700, 712, 257/704, 701, 713, 717

[56] References Cited

U.S. PATENT DOCUMENTS

| 4,902,854 | 2/1990 | Kaufman | 174/52.4 |
| 5,012,386 | 4/1991 | McShane et al. | 257/700 |

Primary Examiner—William Mintel
Assistant Examiner—Roy Potter

[57] ABSTRACT

A heat spreader formed of copper or copper alloys is direct bonded to an electronic device package which includes a multilayer substrate formed of alternating layers of ceramic and metallic plating.

18 Claims, 7 Drawing Sheets

DIRECT BONDED HEAT SPREADER

This invention relates to dissipation of thermal energy generated by electronic devices. More particularly, it relates to packaging of semiconductor electronic devices to ensure rapid distribution and dissipation of internally generated heat.

Modern microelectronic devices may contain literally millions of electronic components such as resistors, capacitors, diodes and transistors. To form functioning circuits, these components must be electrically interconnected, mechanically supported, protected from the environment and supplied with electrical power as well as signal input/output leads.

The typical microelectronics device is an integrated circuit formed in a piece of semiconductor material such as silicon in the form of a die or chip. The die is usually mounted in a package or on a supporting substrate which is sometimes called a chip carrier, housing or electronic device package. The package mechanically supports the die; protects the die from the environment; and provides the necessary electrical connections, sometimes called leads, to external circuitry. Thus the package becomes an integral part of the electronic circuit of the device.

Depending on the application, the package or substrate can be formed of plastic or ceramic material. Plastic has the advantage of being cheaper than ceramic but it is less suitable for powerful circuits which operate at high temperatures. A ceramic package has better electrical and thermal characteristics and can be hermetically sealed to better protect the die. Ceramics, as a broad class of inorganic materials, are good electrical insulators; are more chemically and thermally stable than metals or polymers; and exhibit greater rigidity, hardness and temperature stability than polymers.

In some cases a bare chip or die is treated in the same manner as a small package and attached directly to a support medium such as a circuit board or the like. Since this invention primarily relates to removal of thermal energy from an electronic device (or its supporting packaging) the term "electronic device package" is used herein to include bare semiconductor device chips as well as packages for semiconductor device chips.

During operation, a semiconductor circuit device consumes electrical energy and transforms it into thermal energy (heat). To avoid damage to the die, the internally-generated heat must be removed from the die and dissipated. Some devices have power-handling limitations which are largely determined by their ability to expel internally-generated heat to avoid general or localized thermal gradients or failures. As technology advances such that a die can be made ever more powerful and compact, the problem of rapidly spreading and dissipating internally-generated heat becomes a limiting factor in microelectronic device design.

A heat spreader is sometimes used to conduct heat from the die as quickly as possible. A heat spreader is usually placed in thermal contact with a predetermined surface of the device package or, more preferably, directly in contact with a predetermined surface of the die. A heat spreader is typically made of a highly thermally conductive metal such as aluminum, copper or copper alloy. For example, aluminum has a thermal conductivity of about 205 W/mK at 25° C. Copper has a thermal conductivity of about 398 W/mK at 25° C.

A heat sink is sometimes used to dissipate heat from the microelectronics device to the environment by conduction, convection and/or radiation. For dissipating heat from a microelectronic device, a heat sink is placed in thermal contact with a predetermined surface of the package or an intermediate heat spreader. The body of a heat sink normally has a large cooling surface portion, such as cooling fins or pins, for heat exchange and is normally made of a highly heat conductive material, such as aluminum, which provides a good compromise between thermal conductivity, weight and cost. Although copper or copper-tungsten alloys have much better thermal conductivity, the use of such materials in a large heat sink would, in most cases, produce an extremely heavy and expensive heat sink.

A fan or other fluid circulating system can be used to increase the rate of heat exchange between the heat sink and the environment. For example, a fan can increase the circulation of ambient air over the cooling fins of a heat sink for dissipating heat to the ambient air.

It is also known to apply various surface treatments to the exterior surfaces of heat sinks. Such surface treatments may include, but are not limited to, anodization, electrodeposition, diffusion coating, galvanization, cladding, sprayed metal or paint coatings and conversion coatings as well as various forms of enamels, plastics, rubbers and vacuum-deposited coatings. These treatments are beneficial in that they protect the heat sink from corrosion caused by moisture or other materials in the environment. In addition, certain of the surface treatments described above enable the heat sink to be selectively colored. Darker colors are usually desirable because they enhance the ability of the heat sink to radiate heat to the atmosphere during use.

One of the problems with spreading heat from the die or substrate package through a heat spreader is bonding the heat spreader to the die or package to promote high thermal conductivity to the heat spreader. It is known, for example, to solder or bond a copper plate heat spreader to a predetermined surface of a semiconductor die, usually the back side. Lead-tin solder has a thermal conductivity of about 36 W/mK. It is also known to bond a heat spreader to a predetermined surface of the die with heat-conductive epoxy or the like, but the thermal conductivity of glass epoxy is only about 1.7 W/mK. The heat spreader can be mechanically clamped against a surface of the package without rigidly bonding the surfaces together. An intermediate layer of thermal grease or paste is used to assist the thermal contact between the heat spreader and the package surface. Grease or paste, however, tends to be messy and has a thermal conductivity of only about 1 W/mK. In each case, however, the intermediate layer of bonding material has a relatively low thermal conductivity which reduces the ability of the package to dissipate heat.

According to the invention a direct bonded heat spreader is provided for a microelectronics package. Using direct bonding technology, a heat spreader formed of copper, for example, can be processed with a reactive gas, such as oxygen, and heated to form a eutectic chemical bond directly to an exposed ceramic surface of a device package. The materials of the package must be chosen to survive the heating required in the direct bonding process. Given that ceramics typically have much higher melting points than metal, the melting point of the electrically conducting material in the device is normally the limiting factor. To form a layer of direct bonded metal on an exposed ceramic surface of a chip or package, the metallic materials in the chip or package must have melting points higher than the metal to be bonded to the ceramic surface. The formation or attachment of the heat spreader by means of direct bonding technology avoids the need for an intermediate layer of solder, adhesive, epoxy, grease or other bonding material which could decrease heat transfer to the heat spreader. The invention thus provides a heat spreader and a packaging system for electronic devices which includes a multilayer substrate for mounting an electronic device with a heat spreader positioned adjacent the substrate for dissipating heat. The multilayer substrate is suitable for production of electrical circuits or components having at least one semiconductor chip which may be, for example, a microprocessor chip. The multilayer substrate includes at least two layers of ceramic and at least one layer of metallic plating. In state-of-the-art applications, the substrate can include many successive, alternating layers of ceramic and plating. The plating layers form electrical connections and internal terminals for the semiconductor chip as well as external terminals which allow for connection of the electrical component to an external device or printed circuit board. The platings can be laid down, for example, by thick film processing techniques or silk-screening methods known in the art. The art of making multilayer substrates is continually being improved.

A heat sink may be mounted to the heat spreader. The heat sink is preferably profiled to provide increased surface area for dissipating heat from the heat sink to the environment.

The accompanying drawing is incorporated into and forms a part of the specification to illustrate several examples of the invention. The drawing is for illustrative purposes only and is not to be construed as limiting the invention to only the illustrated and described examples. Various advantages and features of the invention will be apparent from the following description taken in connection with the attached drawing in which.

The invention is described herein by showing various examples of how the invention can be made and used. Like reference characters are used throughout the several views of the drawing to indicate like or corresponding parts.

Figure 1:
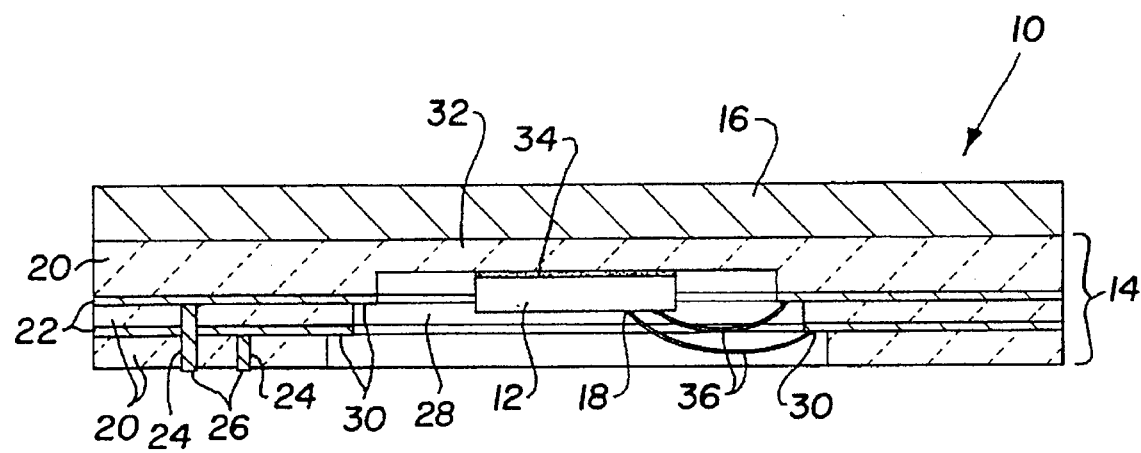
FIG. 1 is a simplified cross-sectional representation of a microelectronics device package including a die mounted to the base of a multilayer substrate and a heat spreader bonded to the back side of the substrate base by means of direct copper bonding technology.

In FIG. 1 the reference numeral 10 generally refers to an electronic device package which includes a die 12, a multilayer substrate 14 and a heat spreader 16. The die 12 may be, for example, an integrated circuit formed of semiconductor material such as silicon which has a plurality of terminal pads 18 for making electrical connections to input/output leads in the multilayer substrate 14.

The multilayer substrate 14 is formed of a plurality of successive alternating and substantially overlapping ceramic layers and metallic plating layers which are schematically represented as ceramic layers 20 and metallic plating layers 22. Although three ceramic layers 20 and three plating layers 22 are illustrated in FIG. 1, it is to be understood that the number of layers could be greater or fewer.

The ceramic layers 20 of the multilayer substrate 14 preferably are formed of ceramic alumina ($Al_2O_3$). More preferably, the ceramic contains a small amount of metal oxide (such as iron, manganese, molybdenum oxide or any combination of the foregoing) with an oxide content of less than ten percent (10%), e.g., between about 4% and 10%. The ceramic provides structural support for the multilayer substrate 14 and is also an electrical insulator for separating the platings 22.

The plating layers 22 of the multilayer substrate 14 consist of metal or metal alloy and define electrically conducting paths and terminals. The plating layers 22 are laid down with a suitable conventional technology such as thick-film technology, silk-screening processes and the like, for production of multilayer substrates.

Reference numeral 24 indicates connections in the multilayer substrate 14 interconnecting selected electrical paths of different plating layers 22 on the inside of the substrate. At least some connections 24 have terminal portions 26 which can be pads, pins or ball terminals for interconnection with external circuitry. The multilayer substrate 14 typically has a plurality of such connections 24 and terminals 26. Selected points on the paths of the plating layers 22 are connected by a plurality of connections 24 to form electrical paths across one or more ceramic layers 20.

The multilayer substrate 14 illustrated in FIG. 1 has a cavity 28 defined in its bottom side. (It is to be understood that the use herein of relative terms such as "bottom," "top," "upper," "lower," "side" and the like are for convenience of description and in reference only to the orientations shown in the drawing.) The sides of the cavity 28 are formed by the ceramic layers 20 defining central openings which are stepped in size. A plurality of terminal ends 30 of the plating layers 22 remain exposed on the bottom surfaces of the ceramic layers 20. The substrate 14 has a base portion 32 formed of one of the ceramic layers 20 which defines the closed end of the cavity 28.

A die 12 can be attached to the base portion 32 of multilayer substrate 14 by any suitable means. As illustrated in FIG. 1, a layer 34 of thermally conductive epoxy is used to mount the die 12 to the base portion 32 of the substrate 14. Terminal pads 18 on the die 12 are electrically connected to the terminal ends 30 of the plating layers 22 to provide electrical communication between the die 12 and the input/output leads on the substrate 14. A heat spreader 16 is bonded to the upper surface of base portion 32 of the substrate 14 by means of the direct copper bonding technology.

Figure 2:
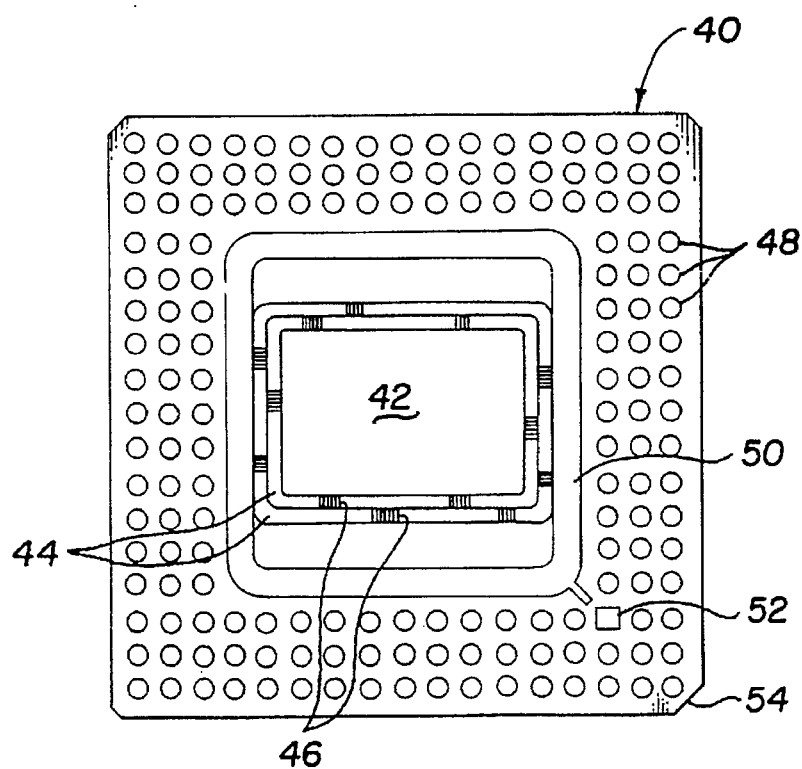
FIG. 2 is a bottom plan view of the multilayer substrate of FIG. 1 before a die is placed thereon.

To aid in understanding the structure of a typical multilayer substrate, FIG. 2 shows an enlarged plan view of a multilayer substrate 40 according to the simplified representation of FIG. 1. The substrate 40 is typically formed to have a generally square shape but the overall shape is a matter of design convenience. The thickness of the package is usually small relative to the other dimensions.

The substrate 40 has a base portion 42 which can be seen in the center of the plan view. A plurality of ceramic layers and plating layers form steps 44 defining the sides of a shallow cavity. A plurality of terminal pads 46 formed from the plating layers remain exposed on the steps 44. The terminal pads 46 correspond to the exposed terminal ends 30 of plating layers 22 represented in FIG. 1. The lower surface of the substrate 40 shown in FIG. 2 has a plurality of input/output terminal pads 48 which correspond to the terminal portions 26 represented in FIG. 1. The surface of the substrate may have markings, such as indications 50, 52 and corner notch 54, for orienting the substrate properly relative to a die, circuit board or the like during fabrication, assembly, testing or use.

The heat spreader 16 is preferably formed of copper and connection of the copper heat spreader 16 to the ceramic of the multilayer substrate is preferably accomplished by direct copper bonding. For the multilayer substrate to survive the direct bonding process, the plating layers 22 must be selected from metallic materials which have a melting point higher than that of the heat spreader material. For a copper heat spreader, for example, the platings 22 can consist of platinum, palladium, molybdenum, tungsten or alloys containing two or more of these metals which have melting points higher than copper. The interlayer connections 24 also consist of conductive material having a melting point higher than that of copper.

In direct bonding a heat spreader 16 to the upper ceramic surface of the multilayer substrate 14 the surface of a cut-out from a copper foil or copper sheet which will form the heat spreader 16 is oxidized in a reactive atmosphere containing oxygen to form copper oxide on the surface of the cut-out. The cut-out is then placed on the upper ceramic surface of the multilayer substrate 14. This formation is then heated in an inert atmosphere such as nitrogen or argon to a processing temperature above the melting temperature of the copper oxide formed but below the melting temperature of the unoxided copper beneath the surface of the copper cut-out. The processing temperature, which is preferably about 1,072° C. (1,962° F.), is also lower than the melting temperature of the metallic platings 22. The contacting oxidized surface of the heat spreader 16 chemically fuses to form a eutectic bond with the contacting surface of the ceramic base portion 32 such that no intermediate bonding material is required. Thus, the transfer of heat from the ceramic base portion 32 of the substrate 14 to the highly heat conductive copper can be very rapid, thus increasing the ability of the heat spreader 16 to spread heat from die 12 and substrate 14. Variations in the direct bonding process are known. For example, it may be possible to combine the steps of oxidizing the copper surface of the cut-out and heating the materials to form a eutectic bond with the ceramic.

Figure 3:
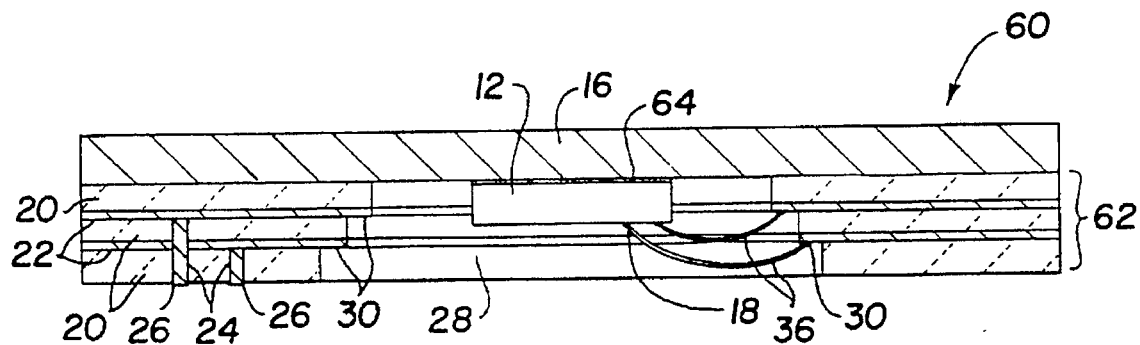
FIG. 3 is a simplified cross-sectional representation of a microelectronics device package in which a copper heat spreader is bonded to a multilayer substrate by means of direct copper bonding technology such that the heat spreader also functions as the substrate base, and a die is mounted directly to the heat spreader.
Figure 4:
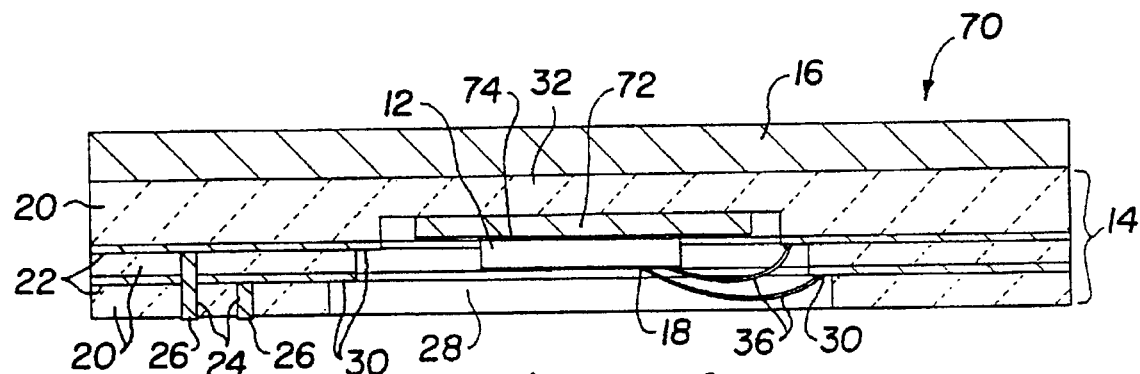
FIG. 4 is a simplified cross-sectional representation of a microelectronics device package similar to FIG. 1 including a second heat spreader positioned intermediate the die and the base of the multilayer substrate.

Alternative configurations of electronic device packages with heat spreaders bonded to the ceramic substrate using the direct copper bonding technology are illustrated in FIGS. 3 and 4. In FIG. 3 the reference numeral 60 generally refers to a device package in which the heat spreader 16 defines the base of the package. The package 60 is similar to package 10 shown in FIG. 1 except for the configuration of the multilayer substrate 62. Like substrate 14 shown in FIG. 1, substrate 62 is similarly formed of a plurality of successive alternating and substantially overlapping ceramic layers and platings which are schematically represented as ceramic layers 20 and plating layers 22, and the substrate 62 has a cavity 28. The sides of the cavity 28 are defined by the ceramic layers 20 having central openings which are stepped in size.

Substrate 62 does not have a ceramic layer extending across the width of the substrate to provide a base portion closing the cavity 28. Instead, the heat spreader 16 provides a base portion for the package 60 and closes the cavity 28. The heat spreader 16 is preferably bonded to the upper ceramic surface of the multilayer substrate 62 using the direct copper bonding process previously described. Thus, the transfer of heat from the circuitry of the substrate 62 to the highly heat conductive copper of the hat spreader 16 can be very rapid, which increases the ability of the heat spreader 16 to spread heat from die 12 and substrate 62. As illustrated in FIG. 3, a layer 64 of thermally conductive epoxy is used to bond the die 12 directly to heat spreader 16. Alternatively, the ceramic material of the die 12 can also be direct copper bonded to the heat spreader 16. Bonding the die 12 directly onto the heat spreader 16 provides an increased rate of heat spreading away from the die.

In FIG. 4 the reference numeral 70 generally refers to a device package which is also similar to package 10 of FIG. 1 except that the die 12 is mounted to the substrate 14 through an intermediate heat spreader 72. The intermediate heat spreader 72 is also preferably formed of copper and is bonded to the base portion 32 of substrate 14 using direct copper bonding technology as previously described. As illustrated in FIG. 4, a layer 74 of thermally conductive epoxy is used to bond the die 12 directly to the intermediate heat spreader 72. Bonding the die 12 onto the intermediate heat spreader 72 provides an increased rate of heat spreading away from the die. Heat spreader 72 can be almost as large as the base of the package or as small as the die 12, depending on the configuration of the die and substrate. Preferably, the intermediate heat spreader 72 should be as large as possible to maximize spreading of heat from the die 12, but circumferentially separated from the surrounding layers defining the cavity 28 in the substrate 14.

Figure 5:
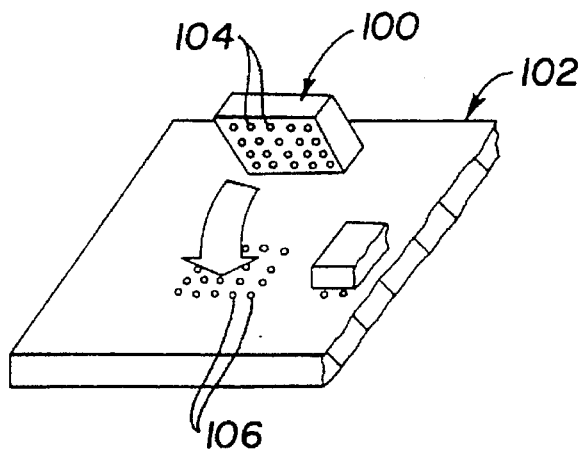
FIG. 5 illustrates prior art flip-chip technology in which the terminals of a bare chip are connected directly to a substrate such as a circuit board.
Figure 6:
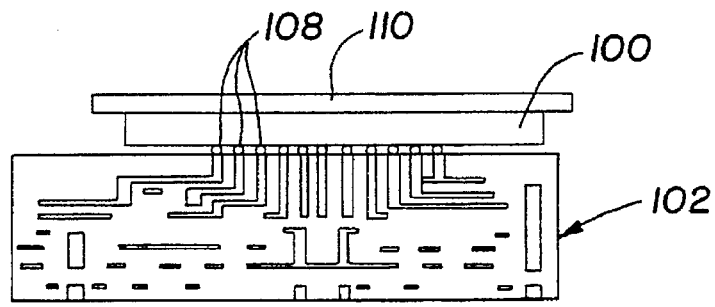
FIG. 6 illustrates a flip-chip having a ceramic body such that a heat spreader can be bonded directly to the back of the flip-chip by means of the direct copper bonding technology prior to positioning the flip-chip onto the substrate.
Figure 8:
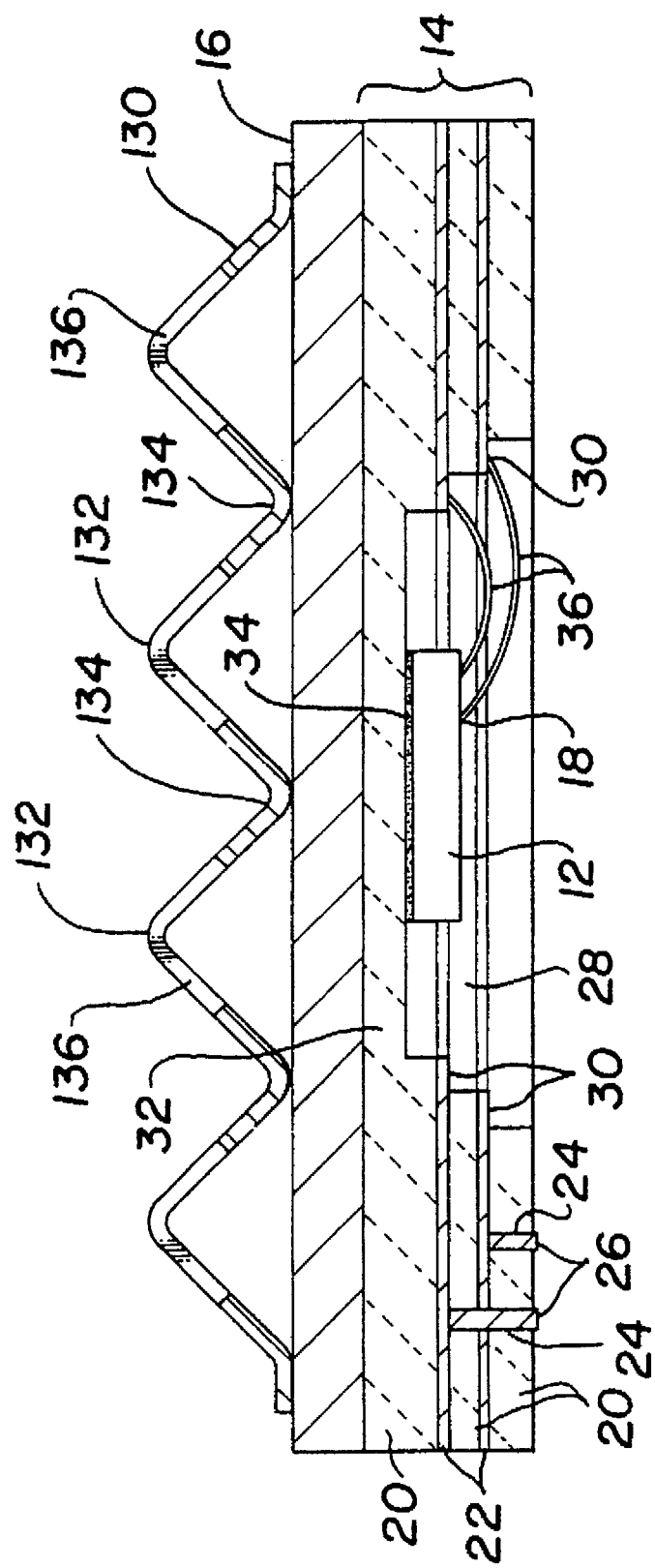
FIG. 8 illustrates a microelectronics device package similar to that shown in FIG. 1 and includes a profiled heat sink bonded to the upper surface of the heat spreader.

In FIGS. 5 and 6 a heat spreader according to the present invention is shown used in connection with flip-chip technology and the like wherein a die 100 is mounted directly on a substrate 102. According to the present invention, the body of the die 100 is formed of a ceramic material. The die 100 carries a plurality of terminals 104 which can be balls, bumps or pads. The substrate 102 has a corresponding plurality of terminals 106 which can be balls, bumps or pads. Solder balls are formed on either the terminals 104 of the die 100 or terminals 106 of the substrate 102. To electrically connect the die 100 to the substrate 102, the flip-chip is positioned on the substrate and the formation is heated to reflow the solder balls on terminals 104 or 106 to make interconnection at solder points 108 as shown in FIG. 8. The die 100 has a copper heat spreader 110 bonded to the upper, exposed side of the die 100 with the direct copper boding process such that no intermediate layer of solder or epoxy is required. The heat spreader 110 provides rapid heat transfer away from the surface of the die 100.

Figure 7:
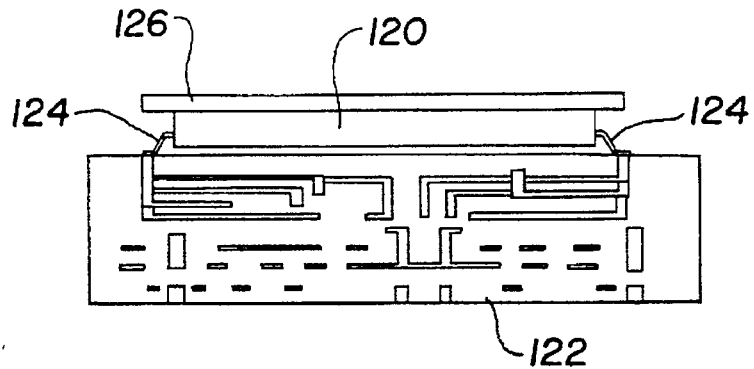
FIG. 7 illustrates a tab package having a ceramic body with a heat spreader bonded directly to the back side thereof by means of the direct copper bonding technology, the tab package having terminals which extend from the edges of the die for connection directly to a substrate such as a circuit board.

FIG. 7 shows a heat spreader according to the present invention used in connection with a tab chip 120 mounted to a substrate 122. According to the present invention, the tab chip 120 has a body formed of ceramic. The tab chip 120 has a plurality of terminal leads 124 extending from the edges of the chip as shown. The substrate 122 has a corresponding plurality of terminals. To electrically connect the tab package 120 to the substrate 122, the ends of the leads 124 can be soldered to the terminals of the substrate as shown in FIG. 7. A copper heat spreader 126 according to the present invention is bonded to the exposed upper side of the tab chip 120 with the direct copper boding process such that no intermediate layer of solder or epoxy is required. The heat spreader 126 provides rapid heat spreading away from the surface of tab chip 120.

Figure 9:
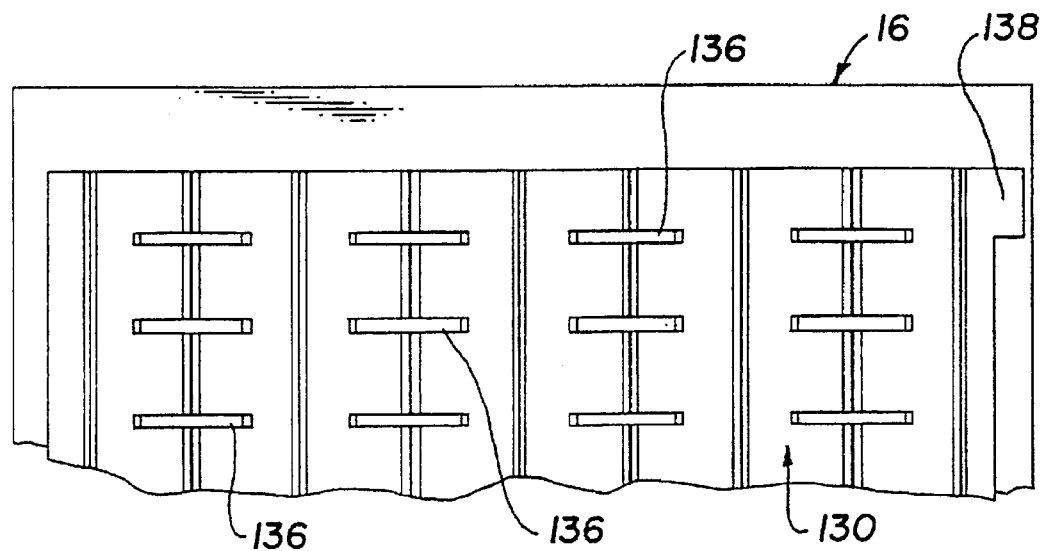
FIG. 9 is a partial top plan view of the package shown in FIG. 8 illustrating slot-like openings in the profiled heat sink.

FIGS. 8 and 9 illustrate a microelectronics package similar to the package 10 of FIG. 1 with a heat sink 130 attached to the heat spreader 16. Heat sink 130 consists of a foil or thin sheet of copper or copper alloy. Heat sink 130 is preferably profiled to have a corrugated configuration with waves 132 and troughs 134 as shown in FIG. 8 and is connected to the heat spreader 16 at the troughs 134 of its profile. To further improve the cooling effect, the profiled heat sink 130 preferably has slot-like openings 136 formed in the waves 132 projecting over the heat spreader 16 in a crosswise manner from the axis of the profile or waves. For further stability in mounting the heat sink 130 to the heat spreader 16, the profiled heat sink 130 is shaped in such a manner that the edges running parallel with the profiled waves 132 are directly connected to the heat spreader 16, i.e., the edges of the heat sink 130 are formed by the segments of the profiles connected to the heat spreader 16. The heat spreader 16 serves also as a shield for the die 12, protecting it from electric power fields (e.g. ac power fields) or electromagnetic waves. As shown in FIG. 9, the heat spreader 16 is preferably connected to ground through the heat sink 130 at terminal portion 138.

Figure 10:
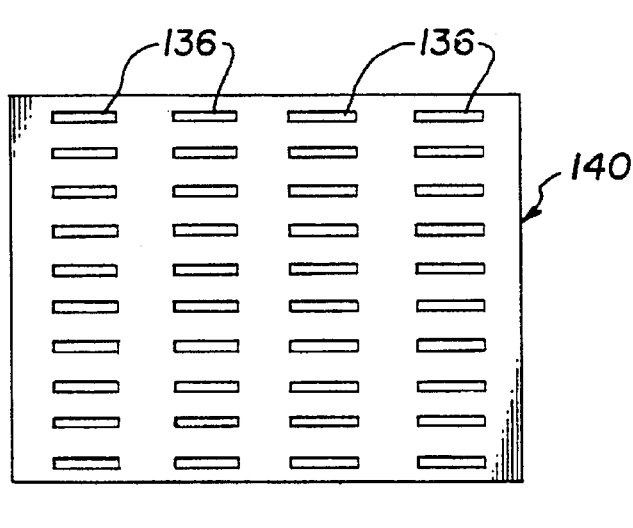
FIG. 10 is a top plan view of a planar sheet of heat sink material having slot-like openings formed therein for making the profiled heat sink shown in FIGS. 8 and 9.
Figure 11:
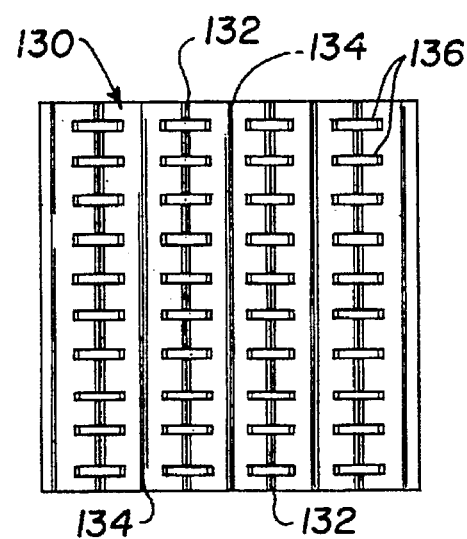
FIG. 11 is a top plan view of the heat sink material of FIG. 10 after it has been profiled to form the structure shown in FIGS. 8 and 9.

FIGS. 10 and 11 illustrate construction of the profiled heat sink 130. A rectangular cut of copper foil or sheet 140 is produced during the first production stage and slot-like openings 136 formed therein. The planar copper or copper alloy sheet 140 is then profiled into the heat sink 130 shown in FIG. 11 by applying waves 132 and troughs 134 with the axis of the waves 132 aligned normal to the slots 136. Other profiles such as trapezium, triangular or finned may be used to form a heat sink for the microelectronics package.

After attaching the heat spreader 16 and the heat sink 130 to form the microelectronics package, the surfaces of the heat sink 130 preferably receive a special processing such as nickel plating. This special processing can be done by galvanic plating (with an electrical power source) or chemical plating (without an external power source).

Figure 12:
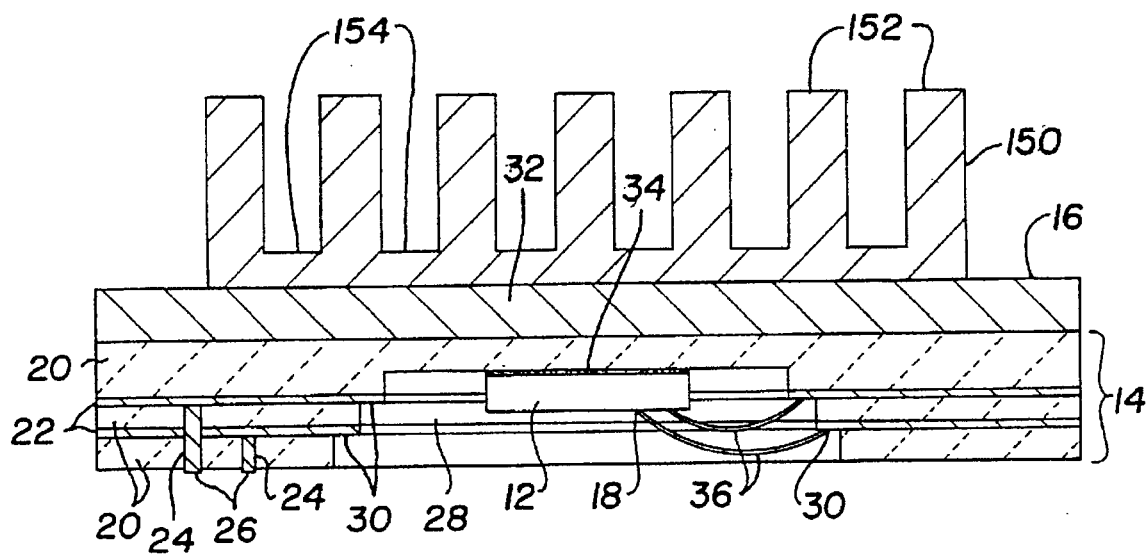
FIG. 12 is a cross-sectional view of a device package similar to FIG. 1 employing a profiled heat sink element according to another embodiment of the invention.
Figure 13:
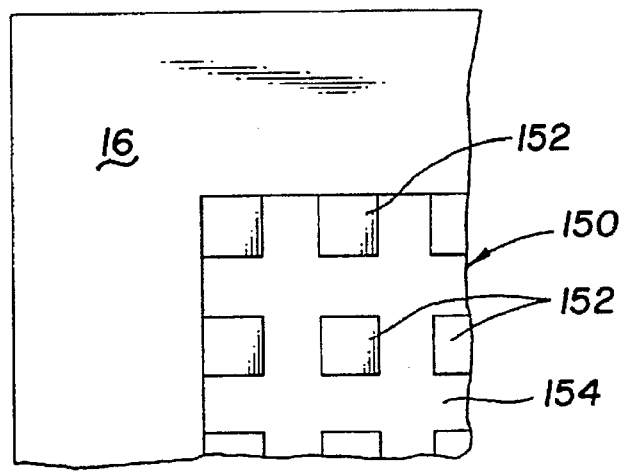
FIG. 13 is a partial top plan view of the package of FIG. 12.

FIGS. 12 and 13 illustrate an alternative embodiment of the microelectronics package of FIGS. 8 and 9. In this embodiment the package contains a heat sink 150 of a different configuration. Heat sink 150 is preferably formed of copper or copper alloy. The heat sink 150 has projections 152 extending upwardly from plate portion 154. The plate portion 152 of the heat sink 150 is attached to the upper side of the heat spreader 16. If desired, these two contacting surfaces can be joined during the direct copper bonding process. The plate-shaped heat sink 150 includes projections 152 extending from the upper side. The projections 152 have the form of cuboids, but they can take the shape of pyramids, knobs, rods, fins, pins, etc.

The cuboid projections 152 are manufactured by using a permanent forming process (e.g. deep drawing, blocking or spinning) and shaping a copper sheet or block. The heat sink 150 with its projections 152 can also be a solid plate-shaped element of copper or copper alloy, e.g., made from an extruded profiled material which exhibits longitudinal studs with grooves between them. To achieve the cuboid projections 152, the profile material on the surface side is milled along the longitudinal axis of the profile in such a way that only the projections 152 remain. Other methods may also be applied in manufacturing the heat sink 150.

If desired, the heat spreader and heat sink can be integrally formed and directly attached to the upper exposed ceramic surface of the substrate.

Figure 14:
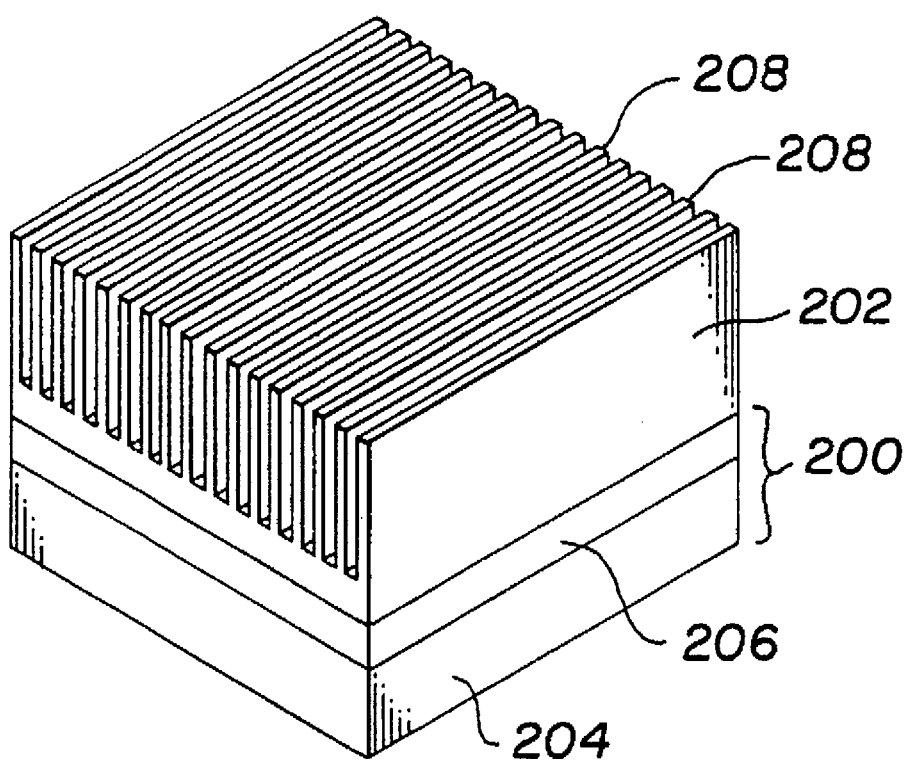
FIG. 14 is a perspective view of an electronic device package having a heat spreader bonded to the base of a substrate and a heat sink mounted to the heat spreader.

FIG. 14 illustrates a device package 200 having a heat sink 202 positioned thereon. The device package includes a housing 204 for a die (not shown) and a heat spreader 206 bonded to the housing 204. The heat spreader 206 is preferably bonded to the housing 204 by the direct copper bonding process. The heat sink 202 can be formed of any suitable thermally conductive material such as aluminum, copper or copper alloy. More preferably, the heat sink is formed of a copper alloy which rapidly conducts heat away from the surface of the package 200 toward the cooling fins 208. The heat sink is preferably profiled to provide increased heat exchange surfaces for dissipating heat to the environment. The heat sink 202 illustrated has been machined or otherwise formed to have a plurality of cooling fins 208 which provide increased surface area for heat exchange with a circulating fluid such as ambient air. The heat sink 202 can be attached to the heat spreader 206 by any suitable means, for example, with mechanical clips or suitable bonding materials.

Microelectronics packages including a multilayer substrate and heat spreader according to the present invention are characterized by simple constructions which include a direct copper bond to the ceramic without an intermediate bonding layer which would reduce the transfer of heat to the heat spreader and heat sink. The example embodiments shown and described above are only exemplary. Even though numerous characteristics and advantages of the invention have been set forth in the foregoing description, together with details of the structure and function of the invention, the disclosure is illustrative only. Various changes and modifications may be made in the detail, especially in matters of shape, size and arrangement of the parts, without departing from the spirit and scope of the invention as defined in the appended claims.

What is claimed:

1. An electronic device package comprising:

(a) a metal heat spreader (b) a multilayer substrate having an exposed ceramic surface and a plurality of overlapping alternating layers of ceramic and metal plating having a melting point higher than that of the heat spreader; and (c) a eutectic metal-to-ceramic bond securing said heat spreader to said exposed ceramic surface of said substrate.

2. An electronic device package as defined in claim 1 wherein said heat spreader is formed of copper and said layers of plating are formed of a metal having a higher melting point than copper.

3. An electronic device package as defined in claim 2 wherein said layers of plating are formed of material selected from the group consisting of platinum, palladium, molybdenum, tungsten and alloys thereof.

4. An electronic device package as defined in claim 1 further comprising a heat sink secured to said heat spreader.

5. An electronic device package as defined in claim 4 wherein said heat sink is formed to have profiled features which increase its surface area for heat exchange with the environment.

6. An electronic device package as defined in claim 1 wherein said heat spreader overlaps substantially the entire surface of said multilayer substrate and forms a closed surface of a cavity.

7. An electronic device package as defined in claim 1 wherein said ceramic layers include particles selected from the group consisting of iron, manganese, molybdenum and combinations thereof.

8. A package for an electrical component comprising:
 (a) a multilayer substrate having at least two layers of ceramic and at least one layer of plating separating said layers of ceramic and having a melting point higher than that of copper; and
 (b) a heat spreader formed of a material selected from the group consisting of copper and copper alloys; and
 (c) a direct copper bond securing said heat spreader to said multilayer substrate.

9. An electronic device package comprising:
 (a) a metal heat spreader;
 (b) a multilayer substrate having an exposed ceramic surface and a plurality of overlapping alternating layers of ceramic and metal plating having a melting point higher than that of the heat spreader, each of said alternating layers having a central opening cooperating to define a cavity wherein said heat spreader extends across the multilayer substrate to provide a base portion for the package; and
 (c) a eutectic metal-to-ceramic bond securing said heat spreader to said exposed ceramic surface.

10. An electronic device package as defined in claim 9 wherein said heat spreader is formed of copper.

11. An electronic device package as defined in claim 10 wherein a die is bonded to said heat spreader within said cavity.

12. An electronic device package as defined in claim 11 wherein said die has a ceramic body and a eutectic metal to ceramic bond secures said die said heat spreader.

13. An electronic device package comprising:
 (a) a metal heat spreader;
 (b) a multilayer substrate having a plurality of overlapping alternating layers of ceramic and metal plating having a melting point higher than that of the heat spreader, each of said alternating layers having a central opening cooperating to define a cavity wherein said heat spreader extends across one end of said cavity to provide a base portion for the package; and
 c) a eutectic metal-to-ceramic bond securing said heat spreader to said multilayer substrate.

14. An electronic device package as defined in claim 13 wherein said heat spreader is formed of copper.

15. An electronic device package as defined in claim 14 wherein a die is bonded to said heat spreader within said cavity.

16. An electronic device package as defined in claim 15 wherein said die has a ceramic body and a eutectic metal-to-ceramic bond secures said die to said heat spreader.

17. Electronic devices having rapid distribution and dissipation of internally generated heat comprising in combination:
 (a) a die having a ceramic body with an exposed ceramic surface and plurality of terminals for connection to a substrate;
 (b) a copper heat spreader bonded to said exposed ceramic surface of said die with a eutectic metal to ceramic bond; and
 (c) components of the die having melting points higher than that of the copper in the copper heat spreader.

18. The electronic devices having rapid distribution and dissipation of internally generated heat according to claim 17 wherein the dies are comprised of integrated circuits formed of semiconductor material having a plurality of metal terminal pads for making electrical connections.

* * * * *